(12) United States Patent
Oh et al.

(10) Patent No.: US 10,062,809 B2
(45) Date of Patent: Aug. 28, 2018

(54) LIGHT EMITTING DEVICE PACKAGE, BACKLIGHT UNIT, LIGHTING DEVICE AND ITS MANUFACTURING METHOD

(71) Applicant: LUMENS CO., LTD., Yongin-si, Gyeonggi-do (KR)

(72) Inventors: Seunghyun Oh, Gwangju-si (KR); Seunghoon Lee, Yongin-si (KR); Yungeon Cho, Osan-si (KR); Kangmin Han, Suwon-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 15/657,147

(22) Filed: Jul. 22, 2017

(65) Prior Publication Data

US 2017/0331005 A1    Nov. 16, 2017

Related U.S. Application Data

(63) Continuation of application No. 14/620,706, filed on Feb. 12, 2015, now abandoned.

(30) Foreign Application Priority Data

Feb. 17, 2014    (KR) ........................ 10-2014-0017961

(51) Int. Cl.
*H01L 33/24*    (2010.01)
*H01L 33/54*    (2010.01)
(Continued)

(52) U.S. Cl.
CPC ............ *H01L 33/24* (2013.01); *G02B 6/0073* (2013.01); *H01L 33/502* (2013.01);
(Continued)

(58) Field of Classification Search
CPC ....... H01L 33/24; H01L 33/502; H01L 33/54; H01L 33/60; G02B 6/0073
(Continued)

(56) References Cited

U.S. PATENT DOCUMENTS 4,992,704 A    2/1991  Stinson et al.
5,998,925 A *  12/1999 Shimizu ............. C09K 11/7767
                                                    257/103

(Continued)

FOREIGN PATENT DOCUMENTS

JP    2007-150255 A    6/2007
KR    1020090059622 A   6/2009
KR    1020100132701 A  12/2010

OTHER PUBLICATIONS

Machine translation of Ogawa et al., "Light Emitting Diode Illumination Module and Ilumination device." JP 2007-150255A, Published Jun. 14, 2007, 23 pg(s).

(Continued)

*Primary Examiner* — William N Harris
(74) *Attorney, Agent, or Firm* — Ichthus International Law, PLLC (57) ABSTRACT

Disclosed are a light emitting device package, a backlight unit, and a lighting device which are usable for a display or lighting, and a method of manufacturing the light emitting device package. The light emitting device package includes: a substrate; a light emitting device seated on the substrate; a reflecting member provided on the substrate and provided with a reflector cup surrounding a lateral circumference of the light emitting device; a transparent encapsulant charged in the reflector cup of the reflecting member in a flow state and hardened, and provided with a concave phosphor accommodating space in an upper surface thereof; and a phosphor charged in the phosphor accommodating space in a flow state and hardened.

7 Claims, 11 Drawing Sheets

(51) Int. Cl.
  *H01L 33/50* (2010.01)
  *F21V 8/00* (2006.01)
  *H01L 33/60* (2010.01)

(52) U.S. Cl.
  CPC ............ *H01L 33/505* (2013.01); *H01L 33/54* (2013.01); *H01L 33/60* (2013.01); *H01L 33/507* (2013.01); *H01L 2224/16245* (2013.01); *H01L 2924/181* (2013.01); *H01L 2933/005* (2013.01); *H01L 2933/0033* (2013.01); *H01L 2933/0041* (2013.01); *H01L 2933/0058* (2013.01)

(58) Field of Classification Search
  USPC .......................................................... 362/611
  See application file for complete search history.

(56) References Cited

U.S. PATENT DOCUMENTS

| | | | |
|---|---|---|---|
| 8,178,888 B2 | 5/2012 | Chakraborty et al. | |
| 8,188,492 B2 | 5/2012 | Lee et al. | |
| 9,567,460 B2* | 2/2017 | Lu | C08L 67/02 |
| 2007/0085107 A1* | 4/2007 | Nitta | H01L 33/56 |
| | | | 257/103 |
| 2007/0262339 A1* | 11/2007 | Hussell | C09K 11/7731 |
| | | | 257/99 |
| 2008/0142820 A1* | 6/2008 | Edmond | H01L 33/60 |
| | | | 257/98 |
| 2008/0186733 A1 | 8/2008 | Ho et al. | |
| 2009/0261374 A1* | 10/2009 | Hayashi | H01L 33/62 |
| | | | 257/99 |
| 2009/0267104 A1* | 10/2009 | Hsu | H01L 33/60 |
| | | | 257/99 |
| 2009/0289275 A1* | 11/2009 | Hayashi | B29C 45/0025 |
| | | | 257/99 |
| 2010/0102345 A1* | 4/2010 | Kong | H01L 33/486 |
| | | | 257/98 |
| 2014/0138728 A1* | 5/2014 | Moon | C09K 11/778 |
| | | | 257/98 |
| 2014/0320747 A1 | 10/2014 | Kamada et al. | |
| 2017/0040513 A1* | 2/2017 | Kotani | B29C 45/0001 |
| 2017/0092830 A1* | 3/2017 | Oda | H01L 24/97 |
| 2017/0110632 A1* | 4/2017 | Moon | H01L 33/502 |
| 2017/0301836 A1* | 10/2017 | Park | H01L 33/54 |
| 2017/0345980 A1* | 11/2017 | Yamamoto | H01L 33/62 |
| 2018/0086974 A1* | 3/2018 | Juang | C09K 11/7734 |

OTHER PUBLICATIONS

English Translation of Korean Office Action dated Nov. 21, 2014 in Korean Application No. 10-2014-0017961, 4 pg(s).

* cited by examiner

LIGHT EMITTING DEVICE PACKAGE, BACKLIGHT UNIT, LIGHTING DEVICE AND ITS MANUFACTURING METHOD

CROSS-REFERENCE TO RELATED APPLICATION(S)

This application is a continuation of U.S. application Ser. No. 14/620,706, filed on Feb. 12, 2015, which is now abandoned, which relates to and claims priority to Korean Patent Application Nos. 10-2014-0017961, filed on Feb. 17, 2014, the entire contents of which are incorporated herein by reference in their entirety.

BACKGROUND

1. Field

The present invention relates to a light emitting device package, a backlight unit, a lighting device, and a method of manufacturing the light emitting device package, and more particularly, to a light emitting device package, a backlight unit, and a lighting device which are usable for a display or lighting, and a method of manufacturing the light emitting device package.

2. Description of Related Technology

A light emitting diode (LED) refers to a sort of semiconductor device which is capable of implementing light with various colors by configuring a light emitting source by forming a PN diode of a compound semiconductor. The light emitting device has an advantage in that the light emitting device has a long lifespan, may be implemented to be small and light, and is drivable at a low voltage. Further, the LED is strong against impact and vibration, does not require a preheating time and complex driving, and may be embedded in a substrate or a lead frame and then packaged in various forms, so that the LED may be modulated for various purposes and applied to a backlight unit, various lighting devices, or the like.

SUMMARY

When a light emitting device package in the related art is utilized as a direct type backlight, the light emitting device package is distributed in a wide area through a secondary lens, and in this case, when a width (half-width) or an area of a light distribution curve is small based on a light emitting axis, it may be easy to control light.

However, when a phosphor is formed by dispensing a fluorescent material mixed with an epoxy inside a reflector cup of a reflecting member in the light emitting device package in the related art, a width (half-width) or an area of a light distribution curve is increased based on a light emitting axis, so that it is difficult to control light, and as a result, there is a problem in that a mura phenomenon or a yellow ring phenomenon is generated in a display panel.

In order to solve the problem in the related art, in the light emitting device package in the related art, the package is formed by attaching a phosphor shaped like a sheet and the same thickness to the light emitting device, but in this case, a peeling phenomenon is generated in a boundary surface between the sheet and the light emitting device due to various foreign substances, bubbles, or the like, or there is inconvenience in that a separate phosphor sheet for each light emitting device in accordance with a standard essentially needs to be ordered and manufactured in advance in order to operate a production line of a factory.

The present invention has been made in an effort to provide a light emitting device package, a backlight unit, a lighting device, and a method of manufacturing the light emitting device package, in which it is easy to control light, it is possible to prevent a mura phenomenon and a yellow ring phenomenon, and a phosphor may be firmly and elaborately fixed to prevent a peeling phenomenon of the phosphor, and which achieve excellent durability, and are applicable to all of the packages with various standards in a manufacturing field without a necessity of preparing a separate phosphor sheet to improve versatility. However, the aforementioned objects are illustrative, and the scope of the present invention is not limited by the aforementioned objects.

An embodiment of the present invention provides a light emitting device package, including: a substrate; a light emitting device seated on the substrate; a reflecting member provided on the substrate and provided with a reflector cup surrounding a lateral circumference of the light emitting device; a transparent encapsulant charged in the reflector cup of the reflecting member in a flow state and hardened, and provided with a concave phosphor accommodating space in an upper surface thereof; and a phosphor charged in the phosphor accommodating space in a flow state and hardened.

The phosphor may have a crescent moon shape in which a cross section at a center portion is thick and a cross section at a boundary portion is thin, and have a larger length than a width of the light emitting device.

A part of a boundary of the phosphor may be partially inserted into an inclined surface of the transparent encapsulant.

Another embodiment of the present invention provides a backlight unit, including: a substrate; a light emitting device seated on the substrate; a reflecting member provided on the substrate and provided with a reflector cup surrounding a lateral circumference of the light emitting device; a transparent encapsulant charged in the reflector cup of the reflecting member in a flow state and hardened, and provided with a concave phosphor accommodating space in an upper surface thereof; a phosphor charged in the phosphor accommodating space in a flow state and hardened; and a light guide plate provided at an optical path of the light emitting device.

Still another embodiment of the present invention provides a lighting device, including: a substrate; a light emitting device seated on the substrate; a reflecting member provided on the substrate and provided with a reflector cup surrounding a lateral circumference of the light emitting device; a transparent encapsulant charged in the reflector cup of the reflecting member in a flow state and hardened, and provided with a concave phosphor accommodating space in an upper surface thereof; and a phosphor charged in the phosphor accommodating space in a flow state and hardened.

Yet another embodiment of the present invention provides a method of manufacturing a light emitting device package, including: preparing a substrate; providing a reflecting member on the substrate so that a reflector cup is formed; seating a light emitting device on the substrate inside the reflector cup; charging a transparent encapsulant in the reflector cup of the reflecting member in a flow state so that a concave phosphor accommodating space is formed in an upper surface of the transparent encapsulant; firstly thermally hardening the transparent encapsulant; charging a phosphor in the phosphor accommodating space in a flow state; and secondly thermally hardening the phosphor.

In the charging of the transparent encapsulant, the transparent encapsulant may be insufficiently supplied to the reflector cup, with a smaller quantity than a quantity, with which the reflector cup is fully filled, so that the concave phosphor accommodating space is formed in the upper surface of the transparent encapsulant, and in the charging of the phosphor, the phosphor may be insufficiently supplied to the phosphor accommodating space, with a smaller quantity than a quantity, with which the phosphor accommodating space is fully filled, so that the phosphor has a crescent moon shape in which a cross section at a center portion is thick and a cross section at a boundary portion is thin.

The method may further include: firstly vibrating the substrate so that the transparent encapsulant is widely applied onto the reflector cup after the charging of the transparent encapsulant; and secondly vibrating the substrate so that the phosphor is widely applied onto the phosphor accommodating space after the charging of the phosphor.

Still yet another embodiment of the present invention provides a method of manufacturing a light emitting device package, including: preparing a substrate; providing a reflecting member on the substrate so that a reflector cup is formed; seating a light emitting device on the substrate inside the reflector cup; charging a transparent encapsulant in the reflector cup of the reflecting member in a flow state so that a concave phosphor accommodating space is formed in an upper surface of the transparent encapsulant; charging a phosphor in the phosphor accommodating space in a flow state; rotating the substrate by using centrifugal force; and thermally hardening the transparent encapsulant and the phosphor.

In the rotating of the substrate, a rotation speed or a rotation time for rotating the substrate may be larger than a deformation value by which the phosphor or the transparent encapsulant begins to be deformed by the centrifugal force and smaller than a separation value by which the phosphor and the transparent encapsulant are separated from the reflector cup.

According to the embodiments of the present invention, it is possible to decrease a width (half-width) or an area of a light distribution curve based on a light emitting axis by optimizing a shape of a phosphor, so that it is easy to control light, and it is possible to prevent a mura phenomenon and a yellow ring phenomenon, firmly and elaborately fix the phosphor to prevent a peeling phenomenon of the phosphor, achieve excellent durability, and apply the present invention to all of the packages having various standards in a manufacturing field without a necessity of preparing a separate phosphor sheet, thereby improving versatility. The scope of the present invention is not limited by the effects as a matter of course.

DETAILED DESCRIPTION

Hereinafter, various embodiments of the present invention will be described in detail with reference to the accompanying drawings.

The embodiments of the present invention are provided for more fully describing the present invention to those skilled in the art, and the embodiments below may be modified in various forms, and the scope of the present invention is not limited to the embodiments below. Rather, these embodiments are provided such that this disclosure will be thorough and complete and will fully convey the spirit of the present invention to those skilled in the art. Further, in the drawings, a thickness or a size of each layer is exaggerated for convenience and clarity of description.

Figure 1:
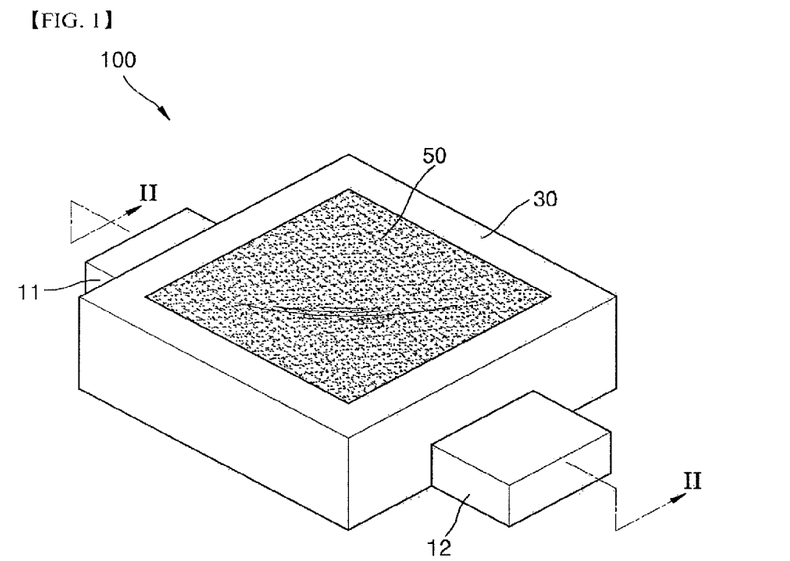
FIG. 1 is a perspective view illustrating a light emitting device package according to an embodiment of the present invention.
Figure 2:
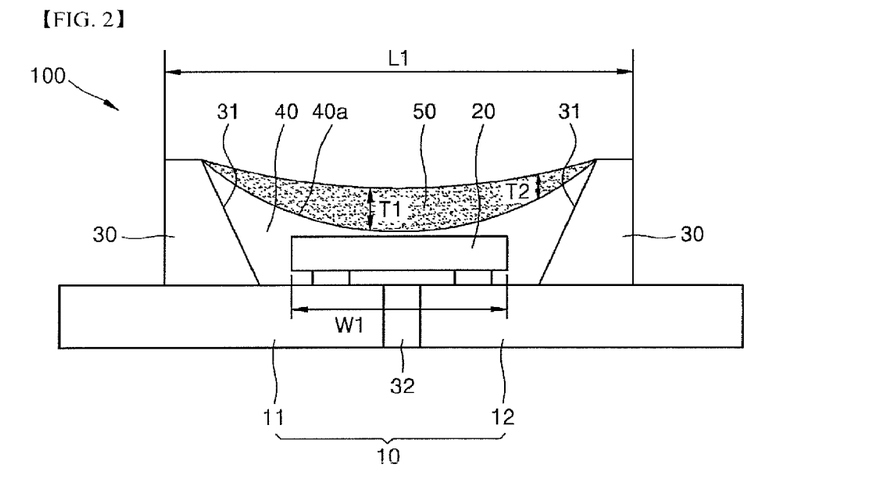
FIG. 2 is a cross-sectional view taken along line II-II of the light emitting device package of FIG. 1.

FIG. 1 is a perspective view illustrating a light emitting device package 100 according to an embodiment of the present invention. FIG. 2 is a cross-sectional view taken along line of the light emitting device package 100 of FIG. 1.

First, as illustrated in FIGS. 1 and 2, the light emitting device package 100 according to the embodiment of the present invention may generally include a substrate 10, a light emitting device 20, a reflecting member 30, a transparent encapsulant 40, and a phosphor 50.

Here, as illustrated in FIGS. 1 and 2, the substrate 10 may include a lead frame provided with a first electrode 11 at one side and a second electrode 12 at the other side relative to an electrode separating space.

The substrate 10 may be made of a material having appropriate mechanical strength and insulation property or a conductive material so as to support or accommodate the light emitting device 20, the reflecting member 30, the transparent encapsulant 40, and the phosphor 50.

For example, an insulation-processed metal substrate, such as aluminum, copper, zinc, tin, lead, gold, and silver, may be applied to the substrate 10, and a plate-shaped substrate or a lead frame-shaped substrate may be applied to the substrate 10.

The substrate 10 may be a printed circuit board (PCB) in which an epoxy-based resin sheet are formed in a multilayer. Further, the substrate 10 may be a flexible printed circuit board (FPCB) formed of a flexible material.

A synthetic resin substrate made of resin and glass epoxy, or a ceramic substrate in consideration of thermal conductivity is applicable to the substrate 10.

The substrate 10 may be partially or entirely formed of one or more selected from an epoxy mold compound (EMC), polyimide (PI), ceramic, graphene, glass synthetic fiber, and combinations thereof so as to enhance processibility.

In the meantime, as illustrated in FIGS. 1 and 2, the light emitting device 20 may be a flip chip type light emitting diode (LED) having a first pad and a second pad.

The light emitting device 20 may be formed of a semiconductor as illustrated in FIG. 1. For example, LEDs formed of a nitride semiconductor and emitting blue, green, red, and yellow light, an LED emitting ultraviolet light, an LED emitting infrared light, and the like may be applied to the light emitting device 20.

A light emitting device having a predetermined wavelength according to a use, such as a display use or a lighting use, may be selected for the light emitting device 20.

Here, an insulating substrate, a conductive substrate, or a semiconductor substrate may be used as a growth substrate if necessary.

A sapphire substrate, a silicon carbide (SiC) substrate, and the like are mainly used as a heterogeneous substrate, and a sapphire substrate is more widely utilized than an expensive silicon carbide substrate.

When the growth substrate is removed, another supporting substrate may be used, and in order to improve light efficiency of an LED chip at an opposite side of the original growth substrate, the supporting substrate may be bonded by using a reflective metal or a reflective structure may be inserted into a center of an adhesive layer.

Patterning of the growth substrate forms concave-convex portions or an inclined surface on a main surface (a surface or both surfaces) or a lateral surface of the substrate before or after an LED structure is grown, thereby improving light extraction efficiency.

Although not illustrated in the drawings, the light emitting device 20 may be a flip chip type including a signal transmitting medium, such as a pump or a solder, in addition to the pad, and in addition, all of a light emitting device, in which a bonding wire is applied to a terminal or a bonding wire is partially applied only to a first terminal or a second terminal, a horizontal light emitting device, a vertical light emitting device, and the like may be applied as the light emitting device 20.

One light emitting device 20 may be provided on the substrate 10 as illustrated in FIGS. 1 and 2, and in addition, a plurality of light emitting devices 20 may be provided on the substrate 10.

Meanwhile, as illustrated in FIG. 1, the reflecting member 30 may be a member that is provided on the substrate 10, and is provided with a reflector cup 31 surrounding a lateral circumference of the light emitting device 20 and an electrode separating portion 32 that fills the electrode separating space.

Here, in the reflecting member 30, the electrode separating portion 32 and the reflector cup 31 may be integrally molded by a mold.

Meanwhile, as illustrated in FIG. 1, the transparent encapsulant 40 may be charged in the reflector cup 31 of the reflecting member 30 in a flow state and hardened, and provided with a concave phosphor accommodating space in an upper surface 40a thereof, and may be formed of one or more selected from silicon, transparent epoxy, a phosphor, which are materials having relatively small and fine particles, and a combination thereof.

Meanwhile, as illustrated in FIGS. 1 and 2, the phosphor 50 may be charged in the phosphor accommodating space in a flow state and hardened.

The phosphor 50 may include materials, such as a quantum dot (QD), and the phosphor and the QD may be mixed and used or separately used in the LED.

The phosphor 50 may be sprayed and applied onto the LED chip or the light emitting device.

In order to make a difference in light efficiency and a light distribution characteristic, a photoconversion material may be positioned by a remote type, and in this case, the photoconversion material is positioned together with a material, such as a transmissive polymer and glass, according to durability and heat resistance.

The phosphor applying technique is most important in determining a light characteristic in the light emitting device, so that control techniques for a thickness of a phosphor applied layer, uniform distribution of a phosphor, and the like have been variously researched. The QD may also be positioned on the LED chip or the light emitting device by the same method as that of the phosphor, and may be positioned between glass or transmissive polymer materials to convert light.

As illustrated in FIG. 2, the phosphor 50 may have a crescent moon shape in which a thickness T1 of a cross section at a center portion is large and a thickness T2 of a cross section at a boundary portion is small, and a length L1 thereof may be larger than a width W1 of the light emitting device 20.

Accordingly, the light passing through the center portion of the phosphor 50 having the large thickness T1 has a high probability of meeting phosphor particles, so that a quantity or intensity of white light is large, and the light passing through the boundary portion of the phosphor 50 having the small thickness T2 has a low probability of meeting phosphor particles, so that a quantity or intensity of white light is small. Accordingly, it is possible to decrease a width (half-width) or an area of a light distribution curve relative to a light emitting axis, so that it is possible to control light and thus it is possible to prevent a mura phenomenon and a yellow ring phenomenon of the display panel.

That is, when the phosphor in the related art, which is shaped like a sheet and has a uniform thickness, is used, the phosphor has the same thickness, but an optical path at a boundary of the phosphor is relatively and substantially long, so that a mura phenomenon and a yellow ring phenomenon that a bright and yellow ring is viewed in a boundary area of a light distribution curve is generated. However, in the light emitting device package 100 of the present embodiment, since the phosphor 50 has a crescent moon shape in which the thickness T1 of the cross section at the center portion of the phosphor 50 is large and the thickness T2 of the cross section at the boundary portion thereof is small, an optical length is uniform over the entire area, so that a uniform color and brightness are shown even in the boundary area of the light distribution curve, thereby preventing the mura phenomenon and the yellow ring phenomenon.

Here, the shape of the phosphor 50 is not limited to the crescent moon shape. That is, all kinds of thickness variable shape, such as a semicircle shape, a convex lens shape, an old moon shape, and a streamlined shape, in which the thickness T1 of the cross section at the center portion of the phosphor 50 is large and the thickness T2 of the boundary portion thereof is small, may be applied to the shape of the phosphor 50.

Since the length L1 of the phosphor 50 of the present invention is larger than the width W1 of the light emitting device 20, it is possible to maximally suppress light, which leaks without passing through the phosphor 50 at a corner of the light emitting device 20 to prevent even a color mura phenomenon at the boundary.

Figure 3:
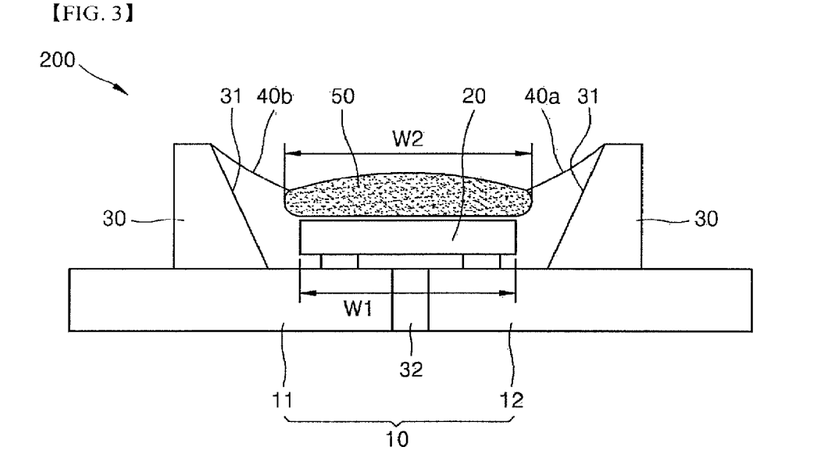
FIG. 3 is a cross-sectional view illustrating a light emitting device package according to another embodiment of the present invention.

FIG. 3 is a cross-sectional view illustrating a light emitting device package 200 according to another embodiment of the present invention.

As illustrated in FIG. 3, a phosphor 50 of the light emitting device package 200 according to another embodiment of the present invention has a larger width W2 than a width W1 of a light emitting device 20, so that the phosphor 50 may have a shape in which a part of a boundary is partially inserted into au inclined surface 40*b* of a transparent encapsulant 40.

The phosphor 50 may generally have a convex lens shape in which a cross section at a center portion has a large thickness and a cross section at a boundary portion has a small thickness.

Accordingly, the light passing through the center portion of the phosphor 50 having the large thickness T1 has a high probability of meeting phosphor particles, so that a quantity or intensity of white light is large, and light passing through the border portion of the phosphor 50 having the small thickness T2 has a low probability of meeting phosphor particles, so that a quantity or intensity of white light is small. Accordingly, it is possible to decrease a width (half-width) or an area of a light distribution curve based on a light emitting axis, so that it is possible to control light and thus it is possible to prevent a mura phenomenon and a yellow ring phenomenon of the display panel.

That is, in the light emitting device package 200 of the present embodiment, since the phosphor 50 has the convex lens shape in which the thickness T1 of the cross section at the center portion is large and the thickness T2 of the cross section at the boundary portion is small, an optical length may be uniform over the entire area and thus a uniform color and brightness are shown even in a boundary area of a light distribution curve may be shown, thereby preventing the mura phenomenon and the yellow ring phenomenon.

Similar to FIG. 2, as illustrated in FIG. 3, since the width W2 of the phosphor 50 of the present invention is larger than the width W1 of the light emitting device 20, it is possible to maximally suppress light, which leaks without passing through the phosphor 50 at a corner of the light emitting device 20 to prevent even a color mura phenomenon at the boundary.

FIGS. 4 to 8 are cross-sectional views sequentially illustrating a process of manufacturing the light emitting device package 100 of FIG. 2.

Figure 4:
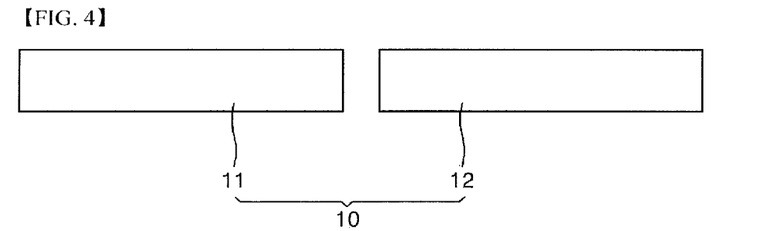
FIGS. 4 to 8 are cross-sectional views sequentially illustrating a process of manufacturing the light emitting device package of FIG. 2.

A process of manufacturing the light emitting device package 100 of FIG. 2 will be sequentially described with reference to FIGS. 4 to 8. First, as illustrated in FIG. 4, the substrate 10 including the first electrode 11 and the second electrode 12 may be prepared.

Figure 5:
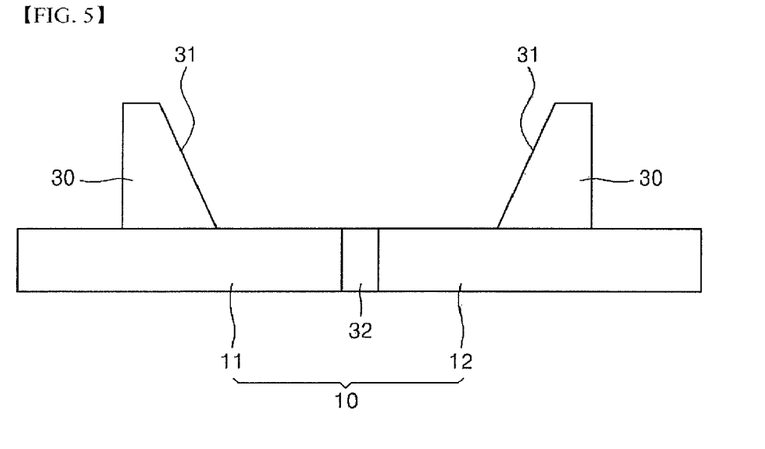

Next, as illustrated in FIG. 5, the reflector cup 31 and the electrode separating portion 32 of the reflecting member 30 may be integrally molded by a mold.

Figure 6:
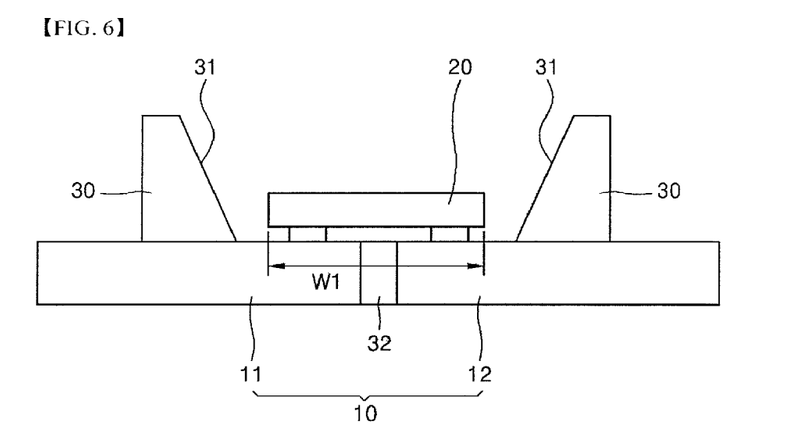

Next, as illustrated in FIG. 6, the light emitting device 20 may be seated on the substrate 10 so that a first pad of the light emitting device 20 is electrically connected to the first electrode 11 and a second pad of the light emitting device 20 is electrically connected to the second electrode 12.

Figure 7:
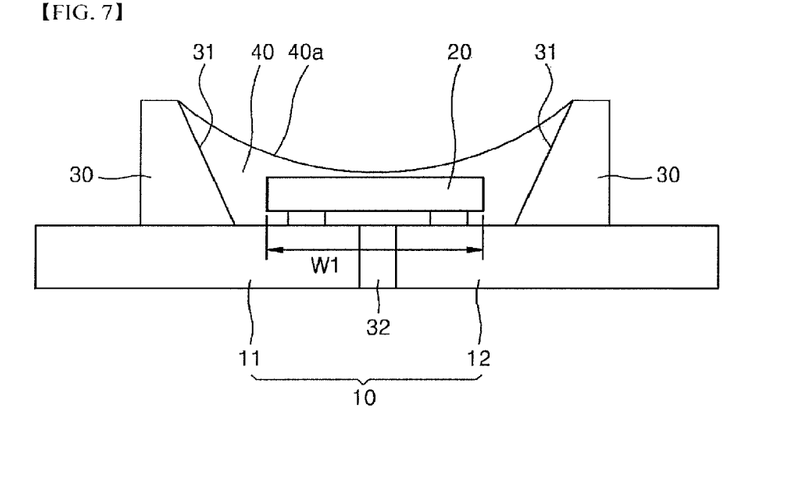

Subsequently, as illustrated in FIG. 7, the transparent encapsulant 40 may be applied or dispensed and charged in the reflector cup 31 of the reflecting member 30 in a flow state so that a concave phosphor accommodating space is formed in an upper surface 40*a*, and the transparent encapsulant 40 may be firstly thermally hardened so that the transparent encapsulant 40 is hardened.

Here, when the transparent encapsulant 40 is applied or dispensed in the reflector cup 31 of the reflecting member 30 in the flow state, the transparent encapsulant 40 is supplied to the reflector cup 31 with a smaller quantity than a quantity, with which the reflector cup 31 is fully filled, and then a vibration may be firstly applied to the substrate 10 so that the transparent encapsulant 40 may be evenly distributed on a lower surface and a lateral surface of the reflector cup 31.

Figure 8:
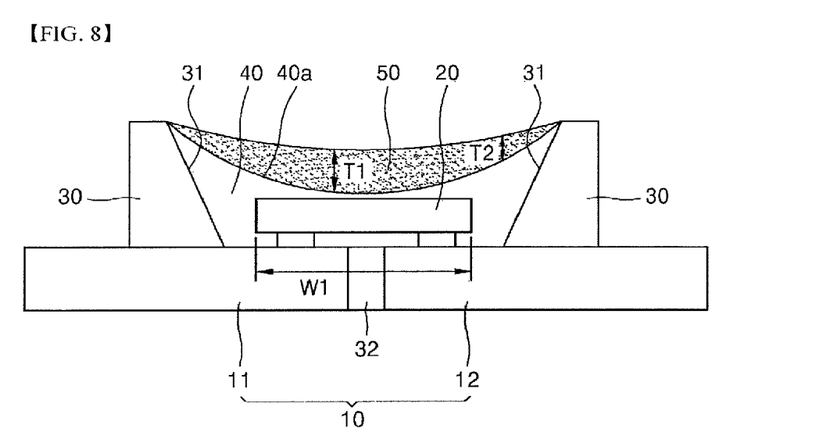

Next, as illustrated in FIG. 8, the phosphor 50 may be applied or dispensed and charged in the phosphor accommodating space in a flow state, and the phosphor 50 may be secondly thermally hardened so that the phosphor 50 is hardened.

Here, when the phosphor 50 is applied or dispensed and charged, the phosphor 50 is supplied to the phosphor accommodating space with a smaller quantity than a quantity with which the phosphor accommodating space is fully filled, and then a vibration may be secondly applied to the substrate 10 so that the phosphor 50 may be evenly distributed in the upper surface 40*a* of the transparent encapsulant 40.

Accordingly, as illustrated in FIG. 8, through the aforementioned process, the transparent encapsulant 40 may be provided with the concave phosphor accommodating space in the upper surface 40*a* thereof, and the phosphor 50 may be formed in a crescent moon shape in which a cross section at a center portion has a large thickness and a cross section at a boundary portion has a small thickness.

Figure 9:
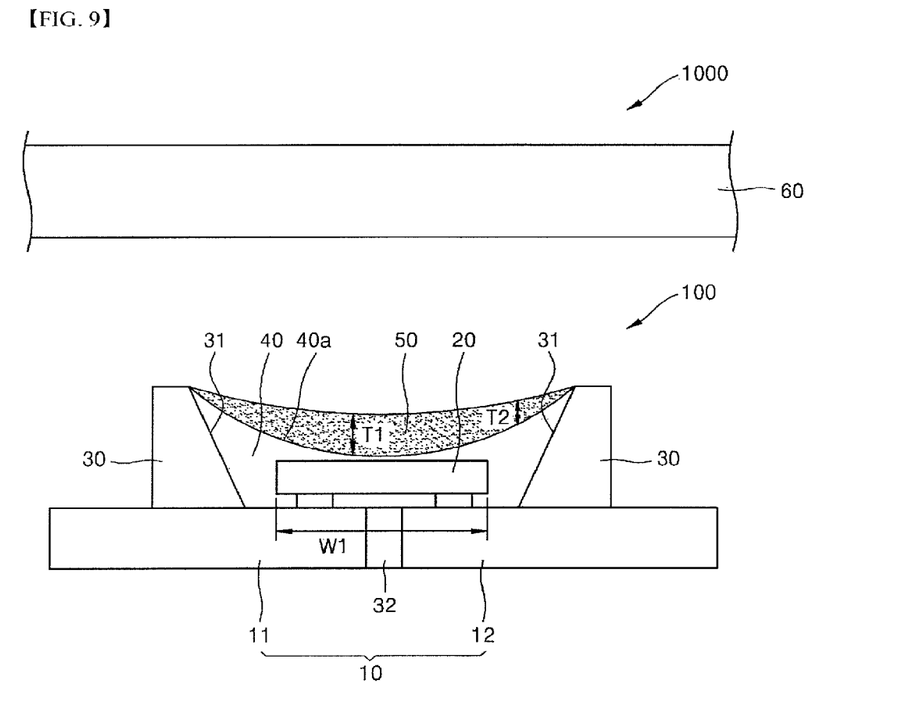
FIG. 9 is a cross-sectional view illustrating a backlight unit according to an embodiment of the present invention.

FIG. 9 is a cross-sectional view illustrating a backlight unit 1000 according to an embodiment of the present invention.

As illustrated in FIG. 9, the backlight unit 1000 according to an embodiment of the present invention may include a substrate 10, a light emitting device 20 seated on the substrate 10, a reflecting member 30 provided on the substrate 10 and provided with a reflector cup 31 surrounding a lateral circumference of the light emitting device 20, a transparent encapsulant 40 charged in the reflector cup 31 of the reflecting member 30 in a flow state and hardened, and provided with a concave phosphor accommodating space in an upper surface thereof, a phosphor 50 charged in the phosphor accommodating space in a flow state and hardened, and a light guide plate 60 provided at an optical path of the light emitting device 20.

Here, the substrate 10, the light emitting device 20, the reflecting member 30, the transparent encapsulant 40, and the phosphor 50 may have the same configurations and functions as those of the light emitting device packages 100 and 200 according to the embodiments of the present invention illustrated in FIGS. 1 to 8. Accordingly, detailed descriptions thereof will be omitted.

The light guide plate 60 may be an optical member which may be made of a transmissive material so as to guide the light generated in the light emitting device 20.

The light guide plate 60 may be provided at a path of the light generated in the light emitting device 20 and transmit the light generated in the light emitting device 20 to a wider area.

Here, although not illustrated in the drawings, various diffusion sheets, prism sheets, filters, and the like may be additionally provided in an upper portion of the light guide plate 60. Further, various display panels, such as an LCD panel, may be provided in the upper portion of the light guide plate 60.

Meanwhile, although not illustrated in the drawings, the embodiments of the present invention may include a lighting device including the aforementioned light emitting device package 100. Here, constituent elements of the lighting device according to the embodiment of the present invention may have the same configurations and functions as those of the aforementioned light emitting package of the embodiment of the present invention. Accordingly, detailed descriptions thereof will be omitted.

FIGS. 10 to 16 are cross-sectional views sequentially illustrating a process of manufacturing the light emitting device package 200 of FIG. 3.

Figure 10:
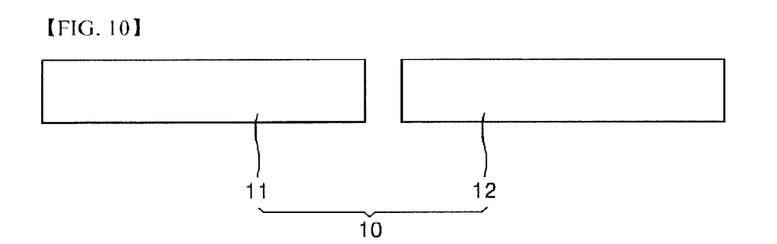
FIGS. 10 to 16 are cross-sectional views sequentially illustrating a process of manufacturing the light emitting device package of FIG. 3.

A process of manufacturing the light emitting device package 200 of FIG. 3 will be sequentially described with reference to FIGS. 10 to 16. First, as illustrated in FIG. 10, the substrate 10 including the first electrode 11 and the second electrode 12 may be prepared.

Figure 11:
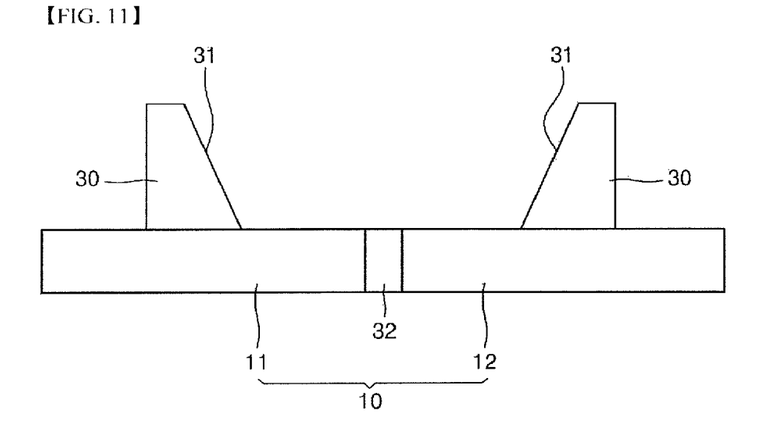

Next, as illustrated in FIG. 11, the reflector cup 31 and the electrode separating portion 32 of the reflecting member 30 may be integrally molded by a mold.

Figure 12:
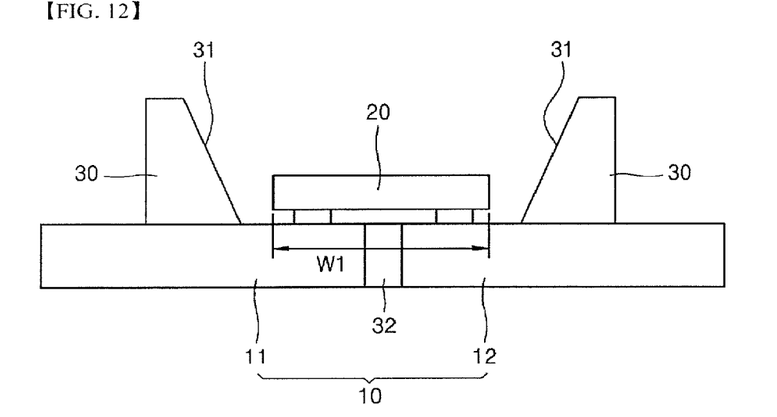

Next, as illustrated in FIG. 12, the light emitting device 20 may be seated on the substrate 10 so that a first pad of the light emitting device 20 is electrically connected to the first electrode 11 and a second pad of the light emitting device 20 is electrically connected to the second electrode 12.

Figure 13:
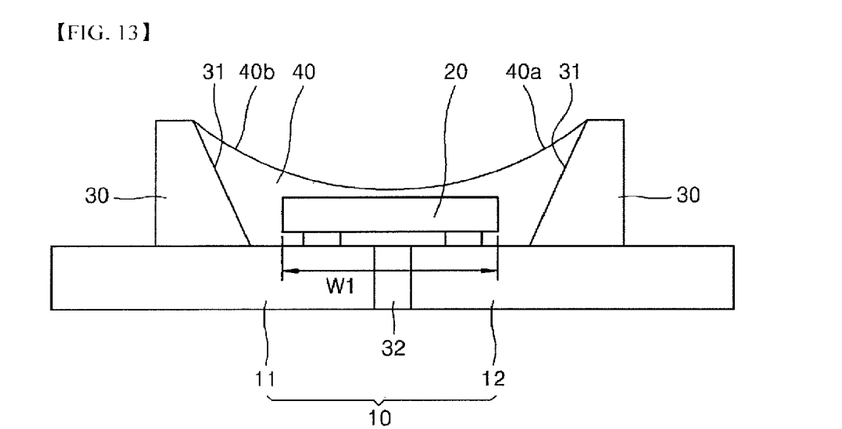

Next, as illustrated in FIG. 13, the transparent encapsulant 40 may be charged in the reflector cup 31 of the reflecting member 30 in a flow state so that a concave phosphor accommodating space is formed in the upper surface 40a thereof.

Here, when the transparent encapsulant 40 is applied or dispensed in the reflector cup 31 of the reflecting member 30 in the flow state, the transparent encapsulant 40 is supplied to the reflector cup 31 with a smaller quantity than a quantity, with which the reflector cup 31 is fully filled, and then a vibration may be firstly applied to the substrate 10 so that the transparent encapsulant 40 may be evenly distributed on a lower surface and a lateral surface of the reflector cup 31.

Figure 14:
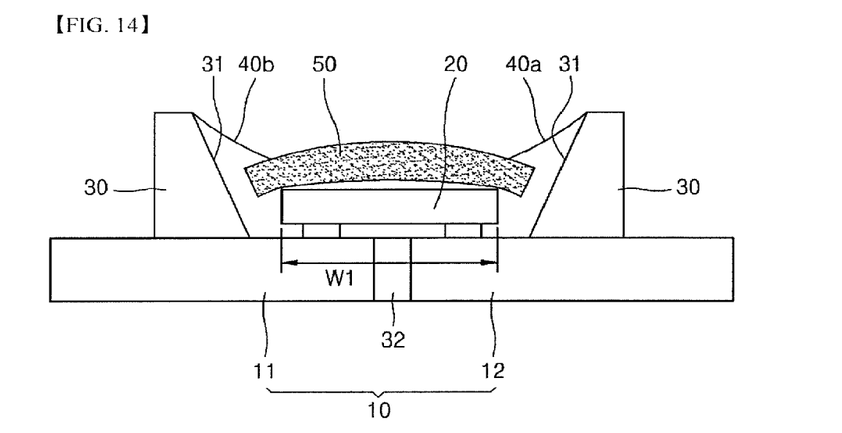

Next, as illustrated in FIG. 14, the phosphor 50 may be charged in the phosphor accommodating space in a flow state.

Here, both of the transparent encapsulant 40 and the phosphor 50 are in a flow state, and the width W2 of the phosphor 50 is larger than the width W1 of the light emitting device 20, so that the phosphor 50 may have a shape in which a part of the boundary is partially inserted into the inclined surface 40b of the transparent encapsulant 40.

Figure 15:
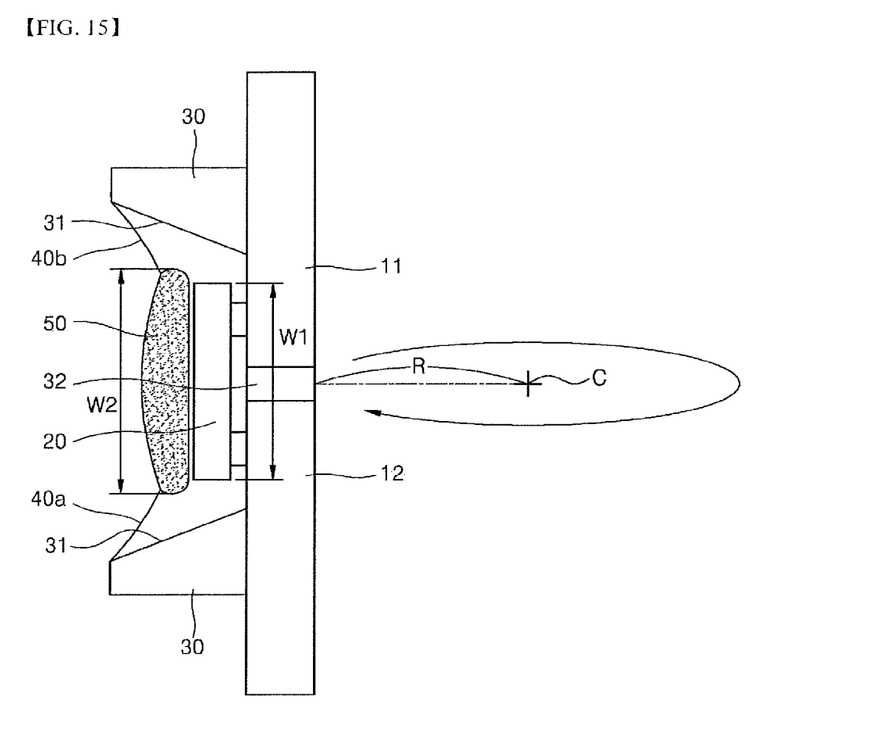

Next, as illustrated in FIG. 15, the substrate 10 may be held in a centrifugal rotating (separating) device and the like, and rotated (revolved) with a rotation radius R about a rotation center C by centrifugal force.

Here, a rotation speed or a rotation time for rotating the substrate 10 may be larger than a deformation value by which the phosphor 50 or the transparent encapsulant 40 begins to be deformed by the centrifugal force but smaller than a separation value by which the phosphor 50 and the transparent encapsulant 40 are separated from the reflector cup 31.

A rotation direction of the substrate 10 may also vary greatly, such as in a vertical direction, a horizontal direction, and an inclined direction, and the substrate 10 may be rotated without the rotation radius R or rotated with the rotation radius R in various sizes.

For example, when the rotation speed or the rotation time is excessively small, it is impossible to use the centrifugal force enough to widely spread the phosphor 50, and when the rotation speed or the rotation time is excessively large, the phosphor 50 and the transparent encapsulant 40 may be separated from the reflector cup 31.

Accordingly, the rotation speed or the rotation time may be optimized and determined by a characteristic, such as viscosity or a flow property, of the phosphor 50 and the transparent encapsulant 40, a processing environment, such as a processing temperature or a processing pressure, and the like.

Here, the end portion of the phosphor 50 may be generally horizontally spread by the centrifugal force. Here, the transparent encapsulant 40 and the phosphor 50 may be thermally hardened while the centrifugal force is applied.

Figure 16:
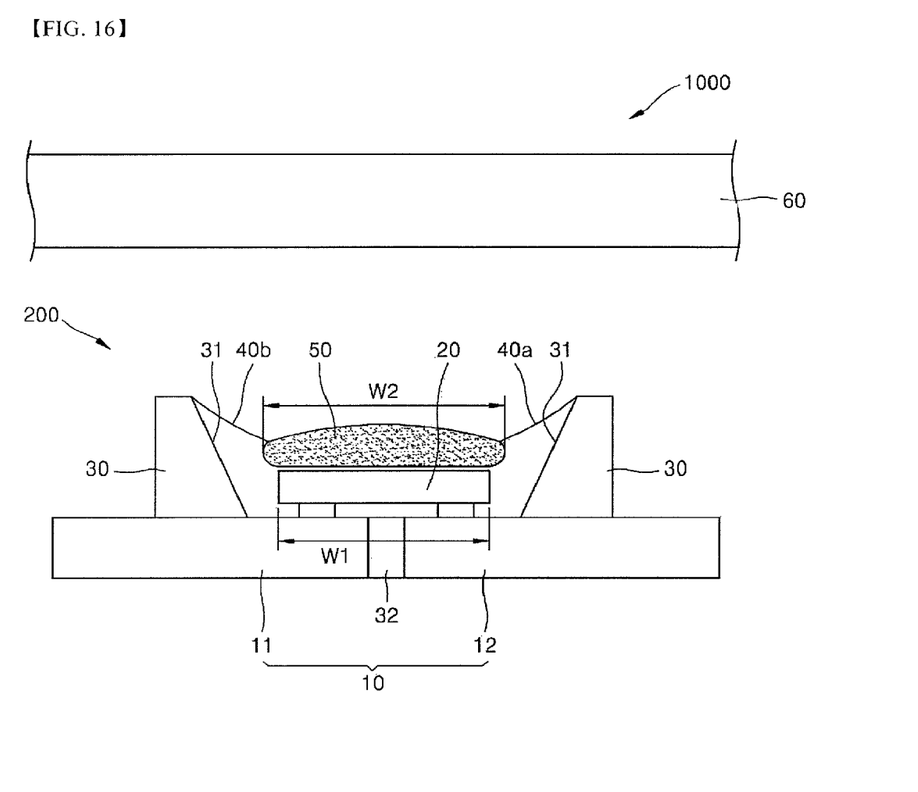

Accordingly, as illustrated in FIG. 16, through the aforementioned process, the transparent encapsulant 40 may be provided with the concave phosphor accommodating space in the upper surface 40a thereof, and the phosphor 50 may be formed in a shape in which a part of the boundary is partially inserted into the inclined surface 40b of the transparent encapsulant 40.

Figure 17:
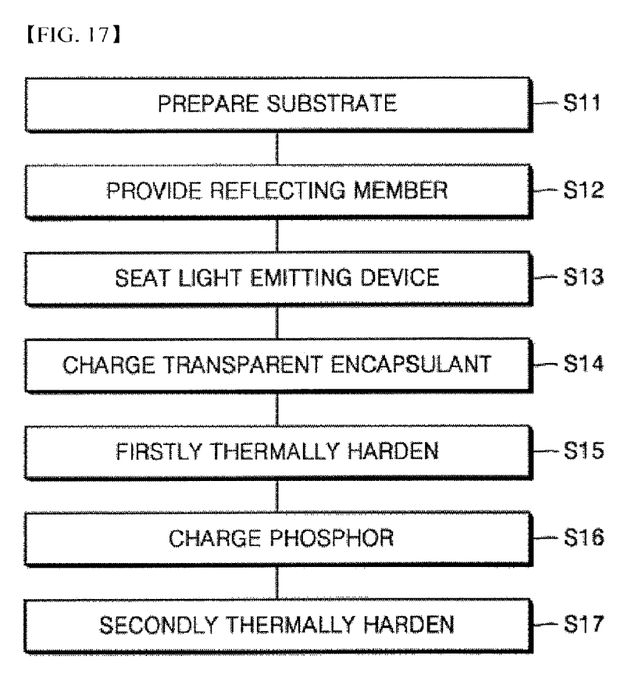
FIG. 17 is a flowchart illustrating a method of manufacturing a light emitting device package according to the embodiment of the present invention.

FIG. 17 is a flowchart illustrating a method of manufacturing the light emitting device package 100 according to the embodiment of the present invention.

As illustrated in FIGS. 2, 4 to 9, and 17, the method of manufacturing the light emitting device package 100 according to the embodiment of the present invention may include preparing a substrate 10 (S11), providing a reflecting member 30 on the substrate 10 so that a reflector cup 31 is formed (S12), seating a light emitting device 20 on the substrate 10 inside the reflector cup 31 (S13), charging a transparent encapsulant 40 in the reflector cup 31 of the reflecting member 30 in a flow state so that a concave phosphor accommodating space is formed in an upper surface 40a (S14), firstly thermally hardening the transparent encapsulant 40 so that the transparent encapsulant 40 is hardened (S15), charging a phosphor 50 in a flow state in the phosphor accommodating space (S16), and secondly thermally hardening the phosphor 50 so that the phosphor 50 is hardened (S17).

Here, in the charging of the transparent encapsulant 40 (S14), the transparent encapsulant 40 may be insufficiently supplied to the reflector cup 31 with a smaller quantity than a quantity with which the reflector cup 31 is fully filled, so that the concave phosphor accommodating space is formed in the upper surface 41a, and in the charging of the phosphor 50 (S16), the phosphor 50 may be insufficiently supplied to the phosphor accommodating space, with a smaller quantity than a quantity with which the phosphor accommodating space is fully filled, so that the phosphor 50 has a crescent moon shape in which a cross section at a center portion is thick and a cross section at a boundary portion is thin.

Figure 18:
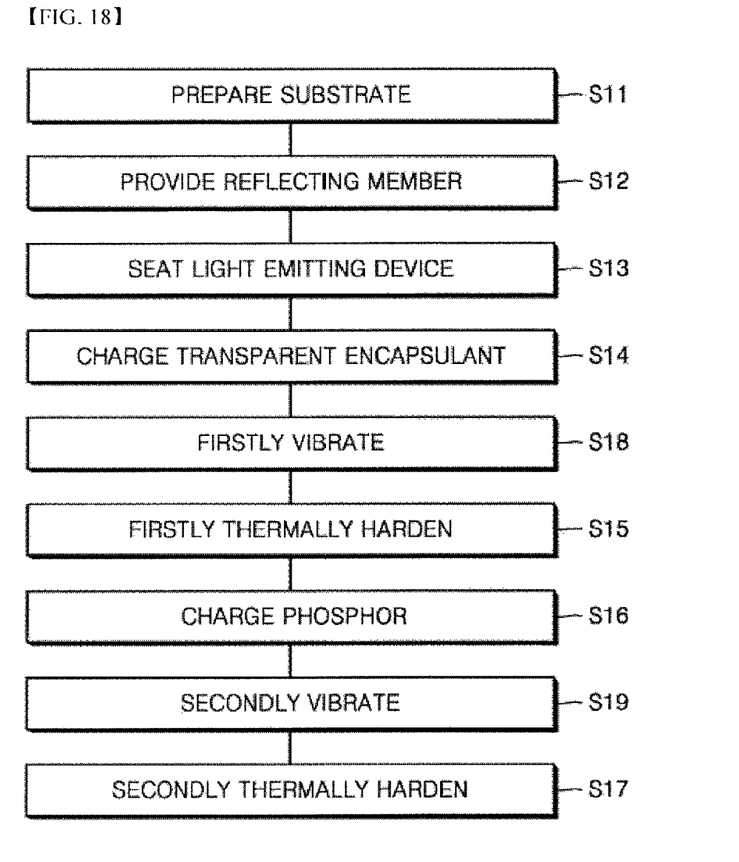
FIG. 18 is a flowchart illustrating a method of manufacturing a light emitting device package according to another embodiment of the present invention.

FIG. 18 is a flowchart illustrating a method of manufacturing the light emitting device package 200 according to another embodiment of the present invention.

As illustrated in FIG. 18, the method of manufacturing the light emitting device package 200 according to the embodiment of the present invention may include preparing a substrate 10 (SI 1), providing a reflecting member 30 on the substrate 10 so that a reflector cup 31 is formed (S12), seating a light emitting device 20 on the substrate 10 inside the reflector cup 31 (S13), charging a transparent encapsulant 40 in the reflector cup 31 of the reflecting member 30 in a flow state so that a concave phosphor accommodating space is formed in an upper surface 40a (S14), firstly vibrating the substrate 10 so that the transparent encapsulant 40 is widely applied onto the reflector cup 31 (S18), firstly thermally hardening the transparent encapsulant 40 so that the transparent encapsulant 40 is hardened (S15), charging a phosphor 50 in a flow state in the phosphor accommodating space (S16), secondly vibrating the substrate 10 so that the phosphor 50 is widely applied onto the phosphor accommodating space (S19), and secondly thermally hardening the phosphor 50 so that the phosphor 50 is hardened (S17).

Figure 19:
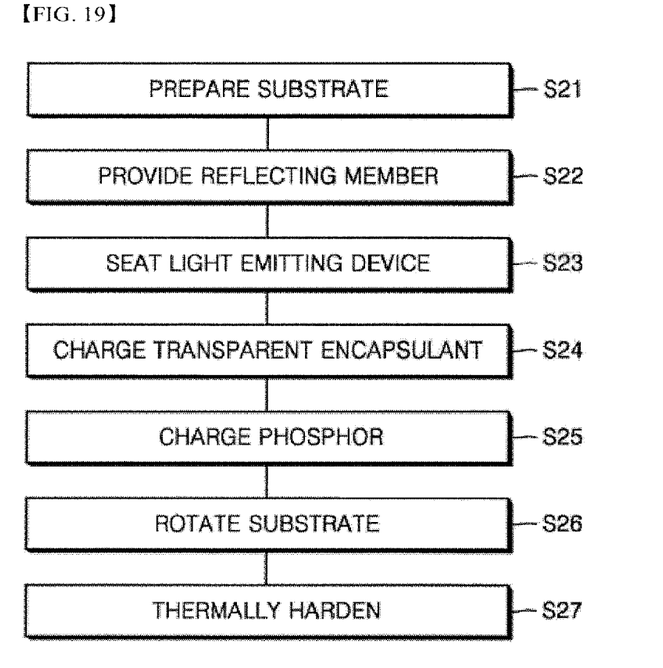
FIG. 19 is a flowchart illustrating a method of manufacturing a light emitting device package according to yet another embodiment of the present invention.

FIG. 19 is a flowchart illustrating a method of manufacturing a light emitting device package 300 according to yet another embodiment of the present invention.

As illustrated in FIGS. 3, 10 to 16, and 19, the method of manufacturing the light emitting device package 300 according to the embodiment of the present invention may include preparing a substrate 10 (S21), providing a reflecting member 30 on the substrate 10 so that a reflector cup 31 is formed (S22), seating a light emitting device 20 on the substrate 10 inside the reflector cup 31 (S23), charging a transparent encapsulant 40 in the reflector cup 31 of the reflecting member 30 in a flow state so that a concave phosphor accommodating space is formed in an upper surface 40*a* (S24), charging a phosphor 50 in a flow state in the phosphor accommodating space (S25), rotating the substrate 10 by centrifugal force (S26), and thermally hardening the transparent encapsulant 40 and the phosphor 50 (S27).

Here, in the rotating of the substrate 10 (S26), a rotation speed or a rotation time for rotating the substrate 10 may be larger than a deformation value by which the phosphor 50 or the transparent encapsulant 40 begins to be deformed by centrifugal force and smaller than a separation value by which the phosphor 50 and the transparent encapsulant 40 are separated from the reflector cup 31.

According to the aforementioned manufacturing methods, it is possible to form a phosphor structure similarly shaped like a sheet on a light emitting device by using a liquid phosphor injection method in the related art even without using a phosphor sheet, thereby economically manufacturing a phosphor structure free from a problem according to the application of the phosphor sheet.

The present invention has been described with reference to the embodiments illustrated in the drawings, but the embodiments are only illustrative, and it would be appreciated by those skilled in the art that various modifications and equivalent embodiments may be made. Therefore, the true technical scope of the present should be defined by the technical spirit of the appended claims.

What is claimed is:

1. A light emitting device package, comprising:
a substrate including a first electrode, a second electrode, and an electrode separating portion between the first electrode and the second electrode;
a light emitting device including a body, a first pad and a second pad, the first pad and the second pad being disposed on a bottom surface of the body facing the substrate, wherein the first pad and the second pad of the light emitting device are coupled to the first electrode and the second electrode, respectively, of the substrate; and
a phosphor layer disposed on a top surface of the body of the light emitting device, wherein the phosphor layer is configured to include a top surface in a form of a convex lens shape, the top surface of the phosphor layer facing away from the light emitting device, and wherein a cross section at a center of the phosphor layer has a larger thickness than a cross section at a boundary area of the phosphor layer such that an optical length is uniform over an entire area of the phosphor layer so as to have a uniform color and brightness in the boundary area of the phosphor layer.

2. The light emitting device package of claim 1, wherein the phosphor layer is configured to include a length of the phosphor layer larger than a width of the light emitting device such that light is maximally suppressed, which leaks without passing through the phosphor layer at a center of the light emitting device.

3. The light emitting device package of claim 1, wherein the phosphor layer is configured to have a shape in such a way that a part of the boundary area of the phosphor layer is partially inserted into an inclined surface of a transparent encapsulant.

4. The light emitting device package of claim 1, wherein a thickest point of the phosphor layer coincides with a center line of the phosphor layer.

5. The light emitting device package of claim 1, wherein the phosphor layer is symmetric relative to a center line of the phosphor layer.

6. The light emitting device package of claim 1, wherein the phosphor layer is configured in such a way that light passing through the center of the phosphor layer has a high probability of meeting phosphor particles and light passing through the boundary area of the phosphor layer has a low probability of meeting the phosphor particles.

7. The light emitting device package of claim 1, wherein the phosphor layer is further configured to decrease a width or an area of a light distribution curve based on a light emitting axis so as to reduce a mura phenomenon and/or a yellow ring phenomenon of a display panel.

* * * * *